US011250902B2

United States Patent
Heymann et al.

(10) Patent No.: US 11,250,902 B2
(45) Date of Patent: Feb. 15, 2022

(54) METHOD AND APPARATUS TO REDUCE POWER CONSUMPTION FOR REFRESH OF MEMORY DEVICES ON A MEMORY MODULE

(71) Applicant: Intel Corporation, Santa Clara, CA (US)

(72) Inventors: Douglas Heymann, Hillsboro, OR (US); Wei P. Chen, Portland, OR (US); Suresh Chittor, Portland, OR (US); George Vergis, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 70 days.

(21) Appl. No.: 16/584,724

(22) Filed: Sep. 26, 2019

(65) Prior Publication Data

US 2020/0027500 A1 Jan. 23, 2020

(51) Int. Cl.
*G11C 11/40* (2006.01)
*G06F 13/16* (2006.01)
*G11C 11/406* (2006.01)
*G01K 13/00* (2021.01)

(52) U.S. Cl.
CPC ........ *G11C 11/40626* (2013.01); *G01K 13/00* (2013.01); *G06F 13/1668* (2013.01)

(58) Field of Classification Search
CPC ........ G11C 11/40626; G11C 11/40611; G01K 13/00; G06F 13/1668; Y02D 10/00
See application file for complete search history.

(56) References Cited

U.S. PATENT DOCUMENTS

| 8,707,072 | B2 | 4/2014 | Wilcox | |
|---|---|---|---|---|
| 9,875,785 | B2* | 1/2018 | Jose | G11C 11/40626 |
| 2008/0120485 | A1* | 5/2008 | Rothman | G06F 12/06 |
| | | | | 711/165 |
| 2011/0205826 | A1* | 8/2011 | Kuroda | G11C 11/40626 |
| | | | | 365/222 |
| 2015/0085594 | A1* | 3/2015 | Dong | G11C 11/40626 |
| | | | | 365/222 |
| 2018/0061478 | A1 | 3/2018 | Vergis et al. | |
| 2020/0176047 | A1* | 6/2020 | Meier | G11C 7/04 |

OTHER PUBLICATIONS

Bhati et al, "DRAM Refresh Mechanisms, Penalties, and Trade-Offs", IEEE Transactions on Computers, vol. 65, No. 1, Jan. 2016, 14 pages.

* cited by examiner

*Primary Examiner* — Ajay Ojha
(74) *Attorney, Agent, or Firm* — Compass IP Law, PC

(57) ABSTRACT

Power consumption for refresh of memory devices on a memory module is reduced by each memory device on the memory module to one of a plurality of sub channels on the memory module. Each sub channel has a thermal sensor that monitors the temperature of the DRAM chips in the region. The refresh rate is increased only for the memory devices in the sub channel in which the memory devices operate above a predefined high temperature. This results in a reduction in power required by the memory module for refresh and an increase in the maximum bandwidth of the memory module.

17 Claims, 5 Drawing Sheets

METHOD AND APPARATUS TO REDUCE POWER CONSUMPTION FOR REFRESH OF MEMORY DEVICES ON A MEMORY MODULE

FIELD

This disclosure relates to memory modules and in particular to refresh of volatile memory devices on a memory module.

BACKGROUND

A memory module is a printed circuit board on which memory integrated circuits ("chips") are mounted to another printed circuit board, such as a motherboard, via a connector (also referred to as a "socket"). The connector is installed on the motherboard and a memory module is inserted into the connector. The connector enables interconnection between a memory module and a circuit on the motherboard.

A dual in-line memory module (DIMM) has separate electrical contacts on each side of the memory module. A memory rank is a set of memory chips connected to the same chip select. A single-rank DIMM has one set of memory integrated circuits that is accessed while writing to or reading from the memory. A dual-rank DIMM is equivalent to two single-rank DIMMs on the same module, with only one rank accessible at a time. A quad-rank DIMM is equivalent to two dual-rank DIMMs on the same module.

Load Reduced Double Data Rate Dual In-Line Memory Module (LR-DIMM) modules reduce the electrical loading on the memory bus by including a memory buffer. The memory buffer increases the memory bus speed by reducing the load for each clock, command, address and data input.

BRIEF DESCRIPTION OF THE DRAWINGS

Features of embodiments of the claimed subject matter will become apparent as the following detailed description proceeds, and upon reference to the drawings, in which like numerals depict like parts, and in which:

Figure 1:
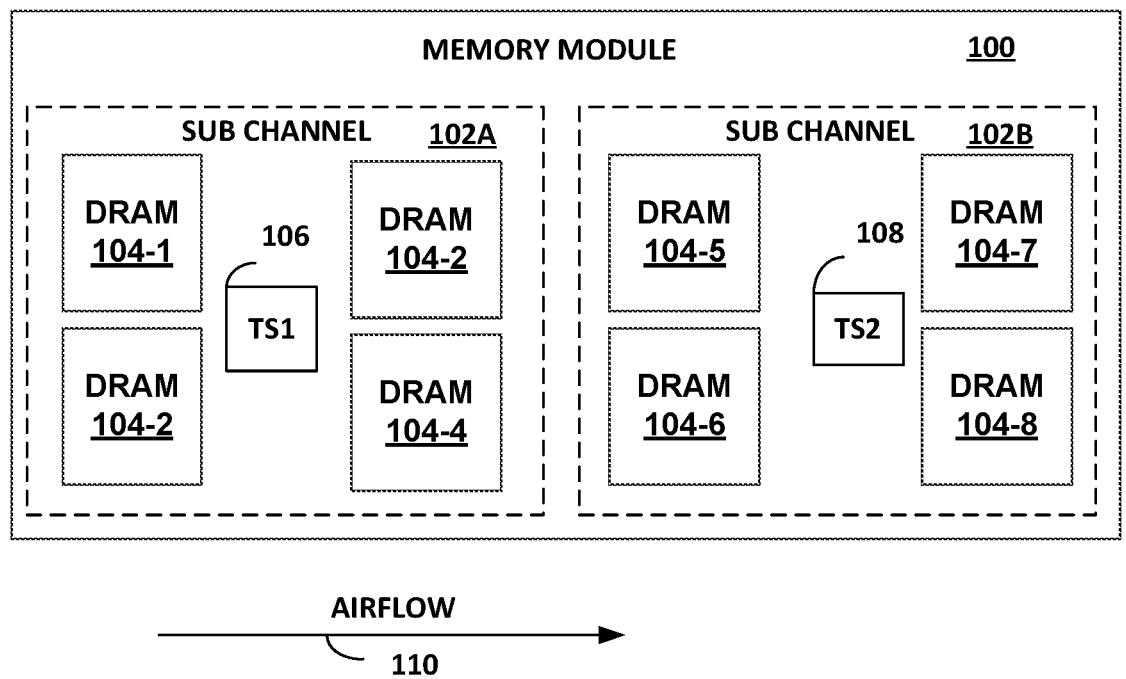
FIG. 1 is a block diagram of a temperature profile of a memory module including a plurality of DRAM chips and two temperature sensors.

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined as set forth in the accompanying claims.

DESCRIPTION OF EMBODIMENTS

The DIMM can include dynamic (read/write) memory, a volatile read/write memory in which the cells require the repetitive application of control signals generated inside or outside the integrated circuit to retain stored data. Each repetitive application of the control signals is normally called a refresh operation or cycle.

A refresh time interval is the time interval between the beginnings of successive signals that are intended to restore the level in a dynamic memory cell to its original level. The refresh time interval is determined by the system in which the dynamic memory operates. A maximum value is specified that is the longest interval for which correct operation of the dynamic memory is to be expected.

The maximum time interval between refresh operations is typically in the range of milliseconds for dynamic (read/write) memory, for example, Dynamic Random Access Memory (DRAM) and is dependent on the ratio of charge stored in memory cell capacitors to leakage currents. Leakage currents increase with temperature, so the time interval between refresh operations is decreased as the temperature increases. For example, the time interval between refresh operations is typically decreased by a factor of 2 (that is, the refresh rate is increased) when the temperature of the DRAM exceeds 85° C. (185° F.).

Refresh operations in DRAM consume power and reduce bandwidth for memory access (read/write operations). For example, the increase in power consumption for a 16 Gigabit (Gb) Quad Rank Load Reduced Double Data Rate Dual In-Line Memory Module with synchronous dynamic random access memory (SDRAM) devices that are compatible with memory technologies such as DDR5 (double data rate version 5), currently in discussion by JEDEC (Joint Electronic Device Engineering Council)) when the time interval between refresh operations is decreased by a factor of 2 could be about 5 Watts. However, if the time interval between refreshes is not decreased the cooling capacity is limited to 85° C. (185° F.).

All DRAM integrated circuits ("chips") on the memory module are refreshed at the same refresh rate but all DRAM integrated circuits ("chips") on a DIMM do not operate at the same temperature. Some DRAM chips may operate at a low temperature below 85° C. (185° F.) and others may operate between 85° C. (185° F.) and 95° C. (203° F.). The time interval between refresh operations only needs to be decreased for the DRAM chips on the memory module that operate between 85° C. (185° F.) and 95° C. (203° F.).

Each DRAM chip on a memory module can be allocated to one of a plurality of regions on the memory module. Each region has a thermal sensor that monitors the temperature of the DRAM chips in the region. The temperature gradient from a DRAM chip in a region at one end of the memory module to a DRAM chip at the other end of the memory module can be about 13° C. (55° F.). The refresh rate is increased only for the region in which DRAM chips operate between 85° C. (185° F.) and 95° C. (203° F.). This reduces power required by the memory module for refresh, keeps the 95° C. DIMM cooling boundary condition, and increases the maximum bandwidth because refresh uses less traffic on the data bus.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

FIG. 1 is a block diagram of a temperature profile of a memory module 100 that includes a plurality of DRAM chips 104-1, ..., 104-8 and two temperature sensors 106, 108. The memory module 100 has two sub channels 102a, 102b with four DRAM chips 104-1, ... 104-4 and temperature sensor 106 in sub channel 102a and four DRAM chips 104-5, ... 104-8 and temperature sensor 108 in sub channel 102b. The airflow direction 110 in a system in which the memory module 100 is operating is from the left of the memory module 100 to the right of the memory module 100. Based on the airflow direction 110 in the system in which the memory module 100 is installed, the DRAM chips 104-1, ... 104-4 at the left of the memory module are cooler than the DRAM chips 104-5, ... 104-8 at the right side of the memory module 100. In the example shown, the operating temperature of DRAM chip 104-1 at the left of the memory module 100 is 74.6° C. and the operating temperature of DRAM chip 104-8 on the right of the memory module 100 is 94.8° C. The embodiment of the memory module 100 shown in FIG. 1 includes two thermal sensors 106, 108, a first thermal sensor 106 located at the left side of the memory module 100 close to DRAM chips 104-1, 104-2 to measure the temperature of the DRAM chips in sub channel 102a and a second thermal sensor 108 at the right side of the memory module 100 close to DRAM chips 104-7, 104-8 to measure the temperature of the DRAM chips in sub channel 102b.

Figure 2:
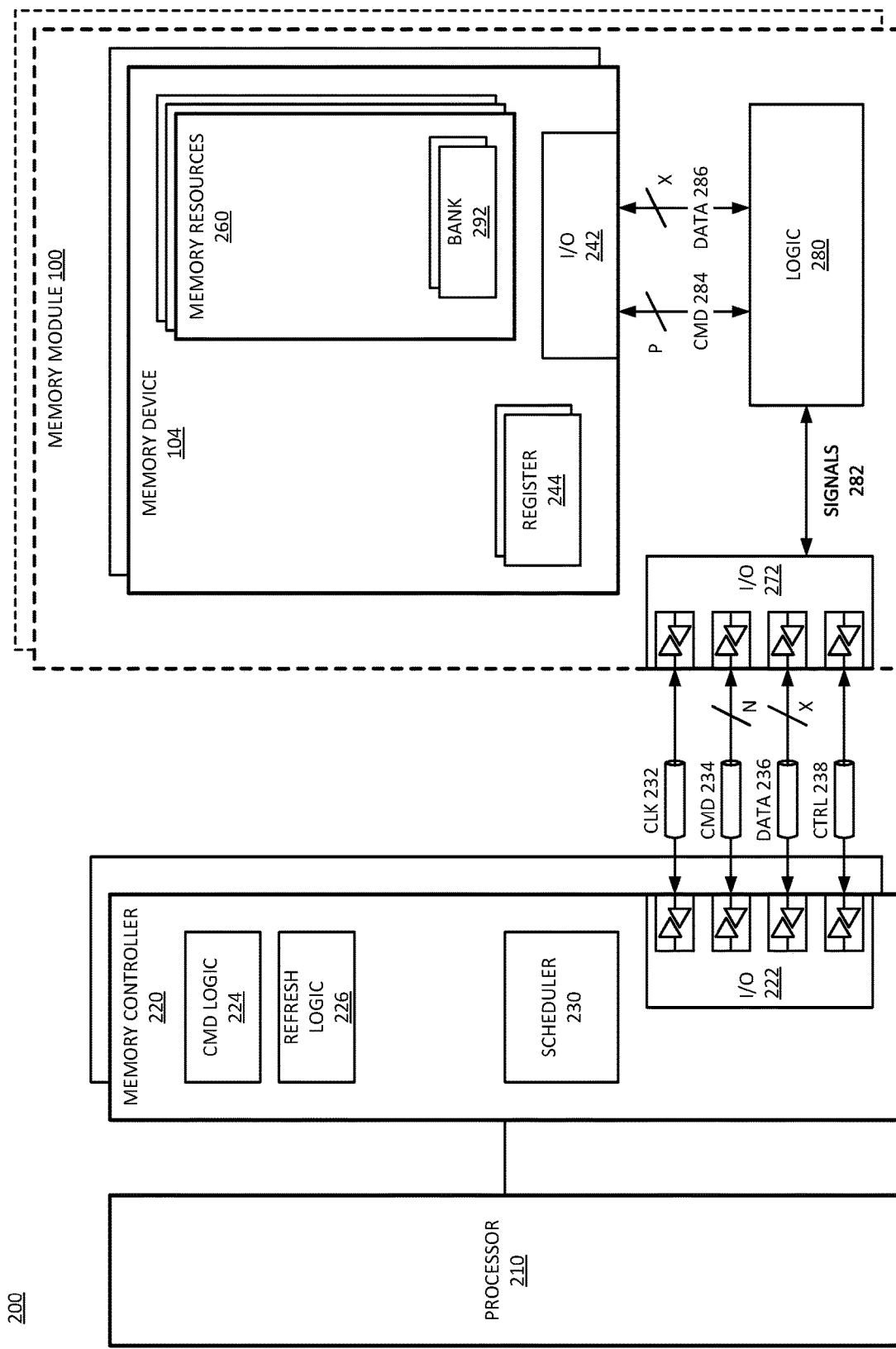
FIG. 2 is a block diagram of an embodiment of a system with a memory subsystem including at least one memory module coupled to a memory controller.

FIG. 2 is a block diagram of an embodiment of a system 200 with a memory subsystem including at least one memory module 270 coupled to a memory controller 220. System 200 includes a processor 210 and elements of a memory subsystem in a computing device. Processor 210 represents a processing unit of a computing platform that can execute an operating system (OS) and applications, which can collectively be referred to as the host or user of the memory. The OS and applications execute operations that result in memory accesses. Processor 210 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or storage controller. Such devices can be integrated with the processor in some systems (for example, in a System-on-Chip (SoC)) or attached to the processer via a bus (e.g., PCI express), or a combination.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, JESD79-4 initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), or others or combinations of memory technologies, and technologies based on derivatives or extensions of such specifications.

Descriptions herein referring to a "RAM" or "RAM device" can apply to any memory device that allows random access, whether volatile or nonvolatile. Descriptions referring to a "DRAM" or a "DRAM device" can refer to a volatile random access memory device. The memory device or DRAM can refer to the die itself, to a packaged memory product that includes one or more dies, or both. In one embodiment, a system with volatile memory that needs to be refreshed can also include nonvolatile memory.

Memory controller 220 represents one or more memory controller circuits or devices for system 200. Memory controller 220 represents control logic that generates memory access commands in response to the execution of operations by processor 210. Memory controller 220 accesses one or more memory devices 240. Memory devices 240 can be DRAM devices in accordance with any referred to above. Memory controller 220 includes I/O interface logic 222 to couple to a memory bus. I/O interface logic 222 (as well as I/O interface logic 242 of memory device 240) can include pins, pads, connectors, signal lines, traces, or wires, or other hardware to connect the devices, or a combination of these. I/O interface logic 222 can include a hardware interface. As illustrated, I/O interface logic 222 includes at least drivers/transceivers for signal lines. Commonly, wires within an integrated circuit interface couple with a pad, pin, or connector to interface signal lines or traces or other wires between devices. I/O interface logic 222 can include drivers, receivers, transceivers, or termination, or other circuitry or combinations of circuitry to exchange signals on the signal lines between the devices.

The exchange of signals includes at least one of transmit or receive. While shown as coupling I/O interface logic 222 from memory controller 220 to I/O interface logic 242 of memory device 240, it will be understood that in an implementation of system 200 where groups of memory devices 240 are accessed in parallel, multiple memory devices can include I/O interfaces to the same interface of memory controller 220. In an implementation of system 200 including one or more memory modules 270, I/O interface logic 242 can include interface hardware of the memory module in addition to interface hardware on the memory device itself. Other memory controllers 220 can include separate interfaces to other memory devices 240.

The bus between memory controller 220 and memory devices 240 can be a double data rate (DDR) high-speed DRAM interface to transfer data that is implemented as multiple signal lines coupling memory controller 220 to memory devices 240. The bus may typically include at least clock (CLK) 232, command/address (CMD) 234, and data (write data (DQ) and read data (DQ0) 236, and zero or more control signal lines 238. In one embodiment, a bus or connection between memory controller 220 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for data (write DQ and read DQ) can be referred to as a "data bus." It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 220 and memory devices 240. An example of a serial bus technology is 8B10B encoding and transmission of high-speed data with embedded clock over a single differential pair of signals in each direction.

In one embodiment, one or more of CLK 232, CMD 234, Data 236, or control 238 can be routed to memory devices 240 through logic 280. Logic 280 can be or include a register or buffer circuit. Logic 280 can reduce the loading on the interface to I/O interface 222, which allows faster signaling or reduced errors or both. The reduced loading can be because I/O interface 222 sees only the termination of one or more signals at logic 280, instead of termination of the signal lines at every one or memory devices 240 in parallel. While I/O interface logic 242 is not specifically illustrated to include drivers or transceivers, it will be understood that I/O interface logic 242 includes hardware necessary to couple to the signal lines. Additionally, for purposes of simplicity in illustrations, I/O interface logic 242 does not illustrate all signals corresponding to what is shown with respect to I/O interface 222. In one embodiment, all signals of I/O interface 222 have counterparts at I/O interface logic 242. Some or all of the signal lines interfacing I/O interface logic 242 can be provided from logic 280. In one embodiment, certain signals from I/O interface 222 do not directly couple to I/O interface logic 242, but couple through logic 280, while one or more other signals may directly couple to I/O interface logic 242 from I/O interface 222 via I/O interface 272, but without being buffered through logic 280. Signals 282 represent the signals that interface with memory devices 240 through logic 280.

It will be understood that in the example of system 200, the bus between memory controller 220 and memory devices 240 includes a subsidiary command bus CMD 234 and a subsidiary data bus 236. In one embodiment, the subsidiary data bus 236 can include bidirectional lines for read data and for write/command data. In another embodiment, the subsidiary data bus 236 can include unidirectional write signal lines for write and data from the host to memory, and can include unidirectional lines for read data from the memory device 240 to the host. In accordance with the chosen memory technology and system design, control signals 238 may accompany a bus or sub bus, such as strobe lines DQS. Based on design of system 200, or implementation if a design supports multiple implementations, the data bus can have more or less bandwidth per memory device 240. For example, the data bus can support memory devices 240 that have either a x32 interface, a x16 interface, a x8 interface, or another interface. The convention "xW," where W is an integer that refers to an interface size or width of the interface of memory device 240, which represents a number of signal lines to exchange data with memory controller 220. The number is often binary, but is not so limited. The interface size of the memory devices is a controlling factor on how many memory devices can be used concurrently in system 200 or coupled in parallel to the same signal lines. In one embodiment, high bandwidth memory devices, wide interface devices, or stacked memory configurations, or combinations, can enable wider interfaces, such as a x128 interface, a x256 interface, a x512 interface, a x1024 interface, or other data bus interface width.

Memory devices 240 represent memory resources for system 200. In one embodiment, each memory device 240 is a separate memory die. Each memory device 240 includes I/O interface logic 242, which has a bandwidth determined by the implementation of the device (e.g., x16 or x8 or some other interface bandwidth). I/O interface logic 242 enables each memory device 240 to interface with memory controller 220. I/O interface logic 242 can include a hardware interface, and can be in accordance with I/O interface logic 222 of memory controller 220, but at the memory device end. In one embodiment, multiple memory devices 240 are connected in parallel to the same command and data buses. In another embodiment, multiple memory devices 240 are connected in parallel to the same command bus, and are connected to different data buses. For example, system 200 can be configured with multiple memory devices 240 coupled in parallel, with each memory device responding to a command, and accessing memory resources 260 internal to each. For a write operation, an individual memory device 240 can write a portion of the overall data word, and for a read operation, an individual memory device 240 can fetch a portion of the overall data word. As non-limiting examples, a specific memory device can provide or receive, respectively, 8 bits of a 128-bit data word for a Read or Write transaction, or 8 bits or 16 bits (depending for a x8 or a x16 device) of a 256-bit data word. The remaining bits of the word are provided or received by other memory devices in parallel.

In one embodiment, memory devices 240 can be organized into memory modules 270. In one embodiment, memory modules 270 represent dual inline memory modules (DIMMs). Memory modules 270 can include multiple memory devices 240, and the memory modules can include support for multiple separate channels to the included memory devices disposed on them.

Memory devices 240 each include memory resources 260. Memory resources 260 represent individual arrays of memory locations or storage locations for data. Typically, memory resources 260 are managed as rows of data, accessed via word line (rows) and bit line (individual bits within a row) control. Memory resources 260 can be organized as separate banks of memory. Banks may refer to arrays of memory locations within a memory device 240. In one embodiment, banks of memory are divided into sub-banks with at least a portion of shared circuitry (e.g., drivers, signal lines, control logic) for the sub-banks.

In one embodiment, memory devices 240 include one or more registers 244. Register 244 represents one or more storage devices or storage locations that provide configuration or settings for the operation of the memory device. In one embodiment, register 244 can provide a storage location for memory device 240 to store data for access by memory controller 220 as part of a control or management operation. In one embodiment, register 244 includes one or more Mode Registers. In one embodiment, register 244 includes one or more multipurpose registers. The configuration of locations within register 244 can configure memory device 240 to operate in different "mode," where command information can trigger different operations within memory device 240 based on the mode. Additionally, or in the alternative, different modes can also trigger different operation from address information or other signal lines depending on the mode. Settings of register 244 can indicate configuration for I/O settings (e.g., timing, termination, driver configuration, or other I/O settings).

Memory controller 220 includes scheduler 230, which represents logic or circuitry to generate and order transactions to send to memory device 240. From one perspective, the primary function of memory controller 220 is to schedule memory access and other transactions to memory device 240. Such scheduling can include generating the transactions themselves to implement the requests for data by processor 210 and to maintain integrity of the data (e.g., such as with commands related to refresh).

Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 220 typically includes logic to allow selection and ordering of transactions to improve performance of system 200. Thus, memory controller 220 can select which of the outstanding transactions should be sent to memory device 240 in which order, which is typically achieved with logic much more complex that a simple first-in first-out algorithm. Memory controller 220 manages the transmission of the transactions to memory device 240, and manages the timing associated with the transaction. In one embodiment, transactions have deterministic timing, which can be managed by memory controller 220 and used in determining how to schedule the transactions.

Referring again to memory controller 220, memory controller 220 includes command (CMD) logic 224, which represents logic or circuitry to generate commands to send to memory devices 240. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 240, memory controller 220 can issue commands via I/O 222 to cause memory device 240 to execute the commands. Memory controller 220 can implement compliance with standards or specifications by access scheduling and control.

Referring again to logic 280, in one embodiment, logic 280 buffers certain signal 282 from the host to memory devices 204. In one embodiment, logic 280 buffers data signal lines 236 as data 286, and buffers command (or command and address) lines of CMD 234 as CMD 284. In one embodiment, data 286 is buffered, but includes the same number of signal lines as data 236. Thus, both are illustrated as having X signal lines. In contrast, CMD 234 has fewer signal lines than CMD 284. Thus, P>N. The N signal lines of CMD 234 are operated at a data rate that is higher than the P signal lines of CMD 284. For example, P can equal 2N, and CMD 284 can be operated at a data rate of half the data rate of CMD 234.

In one embodiment, memory controller 220 includes refresh logic 226. Refresh logic 226 can be used for memory resources 160 that are volatile and need to be refreshed to retain a deterministic state. In one embodiment, refresh logic 226 indicates a location for refresh, and a type of refresh to perform. Refresh logic 226 can execute external refreshes by sending refresh commands. For example, in one embodiment, system 200 supports all bank refreshes as well as per bank refreshes. All bank refreshes cause the refreshing of a selected bank 292 within all memory devices 240 coupled in parallel. Per bank refreshes cause the refreshing of a specified bank 292 within a specified memory device 240.

System 200 can include a memory circuit, which can be or include logic 280. To the extent that the circuit is considered to be logic 280, it can refer to a circuit or component (such as one or more discrete elements, or one or more elements of a logic chip package) that buffers the command bus. To the extent the circuit is considered to include logic 280, the circuit can include the pins of packaging of the one or more components, and may include the signal lines. The memory circuit includes an interface to the N signal lines of CMD 234, which are to be operated at a first data rate. The N signal lines of CMD 234 are host-facing with respect to logic 280. The memory circuit can also include an interface to the P signal lines of CMD 284, which are to be operated at a second data rate lower than the first data rate. The P signal lines of CMD 284 are memory-facing with respect to logic 280. Logic 280 can either be considered to be the control logic that receives the command signals and provides them to the memory devices, or can include control logic within it (e.g., its processing elements or logic core) that receive the command signals and provide them to the memory devices.

Figure 3:
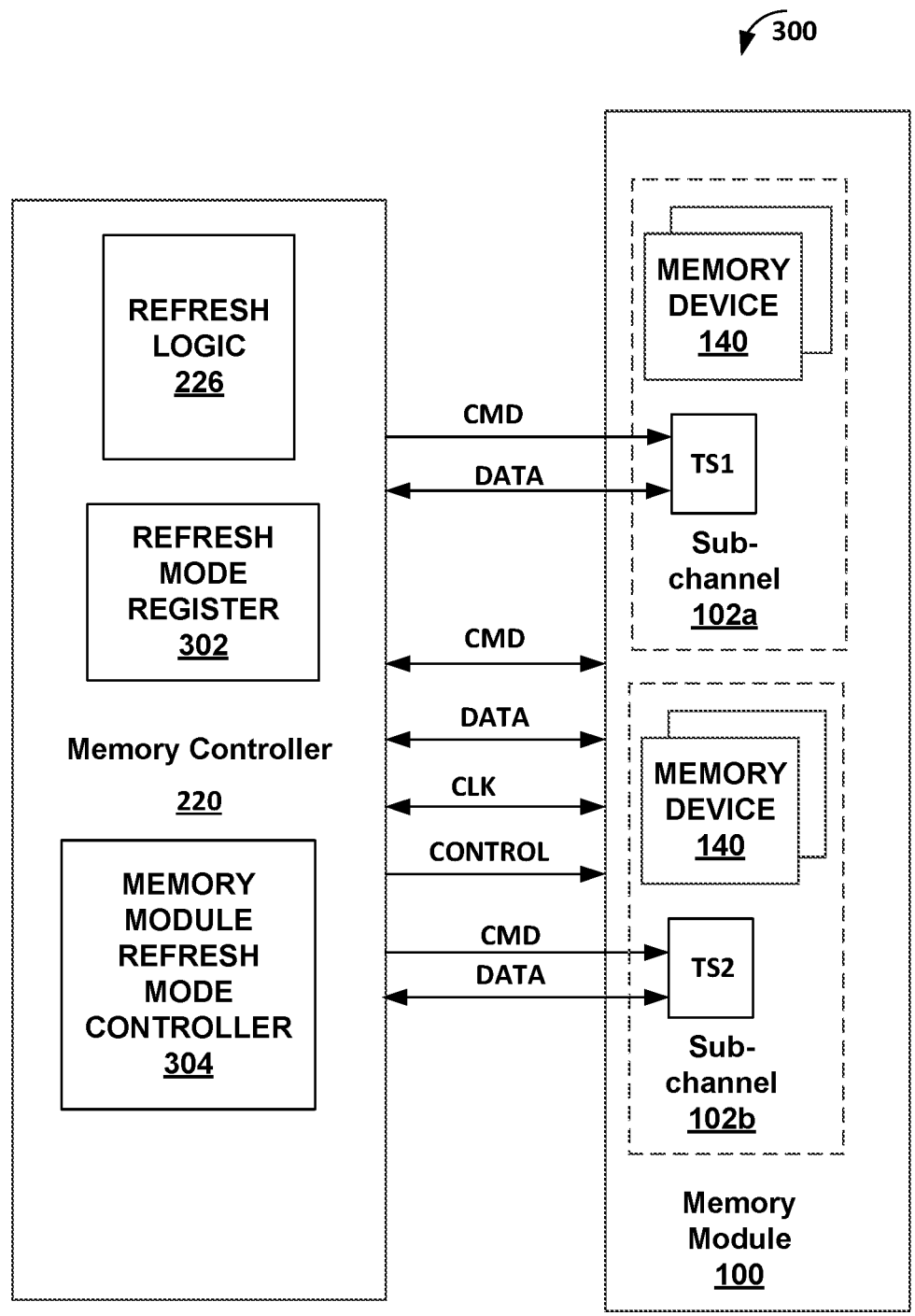
FIG. 3 is a block diagram illustrating the interface between the memory controller and a memory module to monitor temperature of the memory module to select refresh rates for memory devices on the memory module.

FIG. 3 is a block diagram illustrating the interface between the memory controller and a memory module 300 to monitor temperature of the memory module to select refresh rates for memory devices on the memory module. The memory module 300 has two sub channel regions 302a, 302b. Each sub channel 302a, 302b has a plurality of DRAM devices 208 and a temperature sensor (TS1, TS2). All DRAM devices 208 in a sub channel region 302a, 302b share the same chip select signal.

In an embodiment, the memory devices on the memory module are Synchronous Dynamic Random Access Memory (SDRAM) devices that use auto-refresh to refresh the DRAM. Control signals include row access strobe (RAS), column access strobe (CAS), chip select (CS), clock enable (CKE) and write enable (WE).

Typically, an auto-refresh is performed by pre-charging all the opened rows in the SDRAM to bring the SDRAM to the idle state then the memory controller issues an auto-refresh command on the command bus, asserts control signals, row access strobe (RAS) and column access strobe (CAS), along with selecting the SDRAM by chip select (CS). To simplify refresh management, each SDRAM device has an internal refresh counter that tracks the rows to be refreshed during the next refresh operation. The memory controller is responsible for issuing auto-refresh commands at a specified rate to refresh a certain number of rows in all the banks (referred to as all-bank auto-refresh). Normal memory operations resume only after the completion of an auto-refresh operation.

Auto-refresh dissipates substantial power because all of the clocked circuitry in an SDRAM remains active during the entire refresh period. As a result, in addition to the power required for refresh, background power is consumed due to peripheral logic.

A cell in a SDRAM device typically has a 32 milliseconds or 64 milliseconds retention period. Each cell in the SDRAM device must be refreshed or accessed at least once within its retention period (also referred to as a refresh window).

Each auto-refresh command refreshes a number of rows in each bank in the SDRAM device dependent on the total number of rows in the DRAM device. For example, each auto-refresh command for a 4 Gigabit by 8-bits refreshes 8 rows in each bank and the refresh counter is incremented by eight to ensure that 65,536 rows per bank are refreshed during the retention period.

A SDRAM can have a fine-granularity refresh mode that allows a refresh interval time to be modified by the memory controller. For example, the refresh interval time can be divided by two (typically referred to as 2× refresh mode) or four (typically referred to as 4× refresh mode) which allows the number of rows refreshed per auto-refresh command to be decreased by 2 or 4 which results in shortening the time for a refresh command. The refresh interval time for a SDRAM can be dynamically modified to modify the refresh rate based on the temperature of a memory module.

In the embodiment that includes SDRAM that is compatible with DDR4 (DDR version 4, JESD79-4, initial specification published in September 2012 by JEDEC), and extensions of DDR4 specification, the refresh mode of the SDRAM can be programmed by the memory controller via a Mode Register Set (MRS) command to set the refresh mode by setting the appropriate bits in a mode register (for example, bits A6-A8 in mode register 3 (MR3)). For example, bits A6-A8 can be set to '000' for normal refresh mode (fixed 1× refresh mode) and to '001' for fixed 2× refresh mode.

Thermal sensors TS1, TS2 can be coupled to the memory controller 220 via a standard I3C serial bus or a System Management Bus (SMBus) that includes a serial data, serial clock, 3-bit address and event signals. The temperature stored in a register in the thermal sensors TS1, TS2 can be periodically read by the memory controller 220 over a serial data bus to determine if the temperature is high, low or critical.

Figure 4:
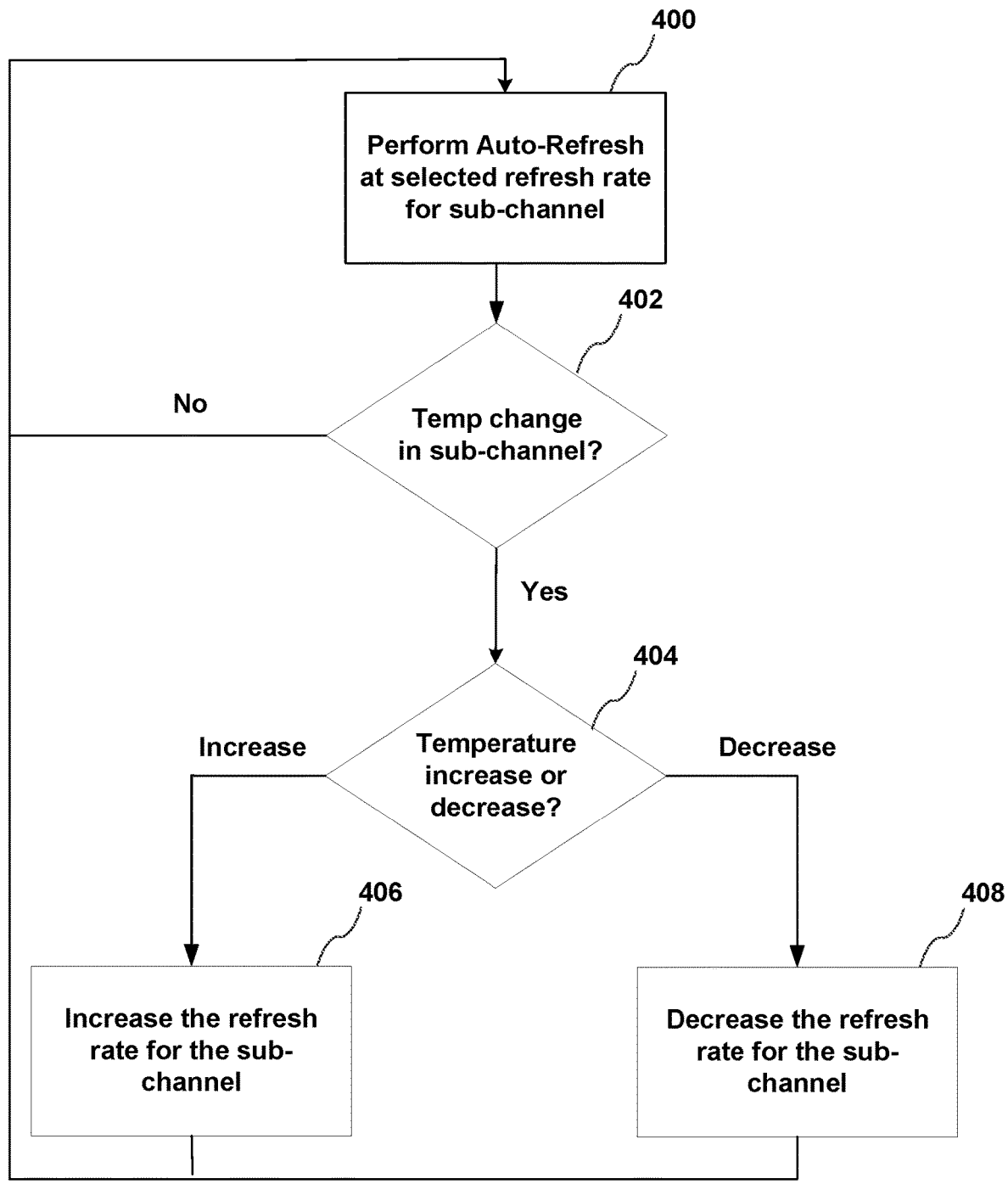
FIG. 4 is a flowgraph illustrating a method performed by memory controller shown in FIG. 3 to monitor the temperature in each sub channel of the memory module and to set the refresh rate for the memory devices in the sub channel based on the temperature read from the temperature sensors on the memory module.

FIG. 4 is a flowgraph illustrating a method performed by memory controller 220 shown in FIG. 3 to monitor the temperature in each sub channel 102a, 102b of the memory module 270 and to set the refresh rate for the memory devices in the sub channel 102a, 102b based on the temperature read from the temperature sensors TS2, TS1 on the memory module 270.

At block 400, the refresh logic 226 in memory controller 270 performs auto-refresh by sending refresh commands to the memory devices 240 in each sub channel 102a, 102b of the memory module at the rate selected for the respective sub channel in the refresh mode register 302 for the respective sub channel 102a, 102b.

At block 402, upon determining that there has been a temperature change by reading the current temperature from the temperature sensors (TS1, TS2) and comparing the current temperature with a previous temperature read from the temperature sensors (TS1, TS2) that is stored in refresh logic 226, processing continues with block 404. Otherwise, processing continues with block 400 to continue to perform auto-refresh at the selected refresh rate.

At block 404, if there is an increase in temperature, processing continues with block 406. If there is a decrease in temperature, processing continues with block 408.

At block 406, the memory module refresh mode controller increases the refresh rate in the refresh mode register for the respective sub channel. Processing continues with block 400 to continue to perform auto-refresh at the increased refresh rate.

At block 408, the memory module refresh mode controller decreases the refresh rate in the refresh mode register for the respective sub channel. Processing continues with block 400 to continue to perform auto-refresh at the decreased refresh rate.

Figure 5:
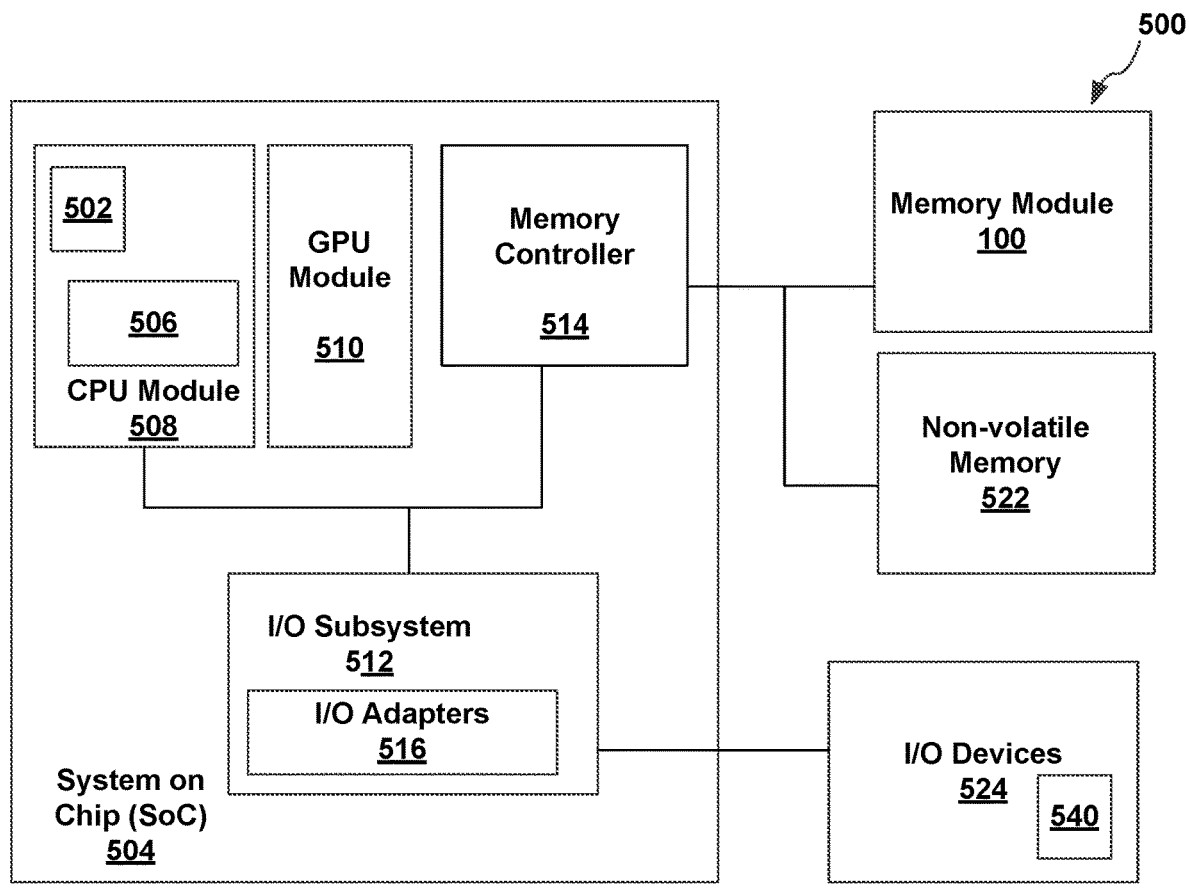
FIG. 5 is a block diagram of an embodiment of a computer system that includes the memory module.

FIG. 5 is a block diagram of an embodiment of a computer system 500 that includes the memory module 100. Computer system 500 can correspond to a computing device including, but not limited to, a server, a workstation computer, a desktop computer, a laptop computer, and/or a tablet computer.

The computer system 500 includes a system on chip (SOC or SoC) 504 which combines processor, graphics, memory, and Input/Output (I/O) control logic into one SoC package. The SoC 504 includes at least one Central Processing Unit (CPU) module 508, a memory controller 514, and a Graphics Processor Unit (GPU) 510. In other embodiments, the memory controller 514 can be external to the SoC 504. The CPU module 508 includes at least one processor core 502, and a level 2 (L2) cache 506.

Although not shown, each of the processor core(s) 502 can internally include one or more instruction/data caches, execution units, prefetch buffers, instruction queues, branch address calculation units, instruction decoders, floating point units, retirement units, etc. The CPU module 508 can correspond to a single core or a multi-core general purpose processor, such as those provided by Intel® Corporation, according to one embodiment.

The Graphics Processor Unit (GPU) 510 can include one or more GPU cores and a GPU cache which can store graphics related data for the GPU core. The GPU core can internally include one or more execution units and one or more instruction and data caches. Additionally, the Graphics Processor Unit (GPU) 510 can contain other graphics logic units that are not shown in FIG. 5, such as one or more vertex processing units, rasterization units, media processing units, and codecs.

Within the I/O subsystem 512, one or more I/O adapter(s) 516 are present to translate a host communication protocol utilized within the processor core(s) 502 to a protocol compatible with particular I/O devices. Some of the protocols that adapters can be utilized for translation include Peripheral Component Interconnect (PCI)-Express (PCIe); Universal Serial Bus (USB); Serial Advanced Technology Attachment (SATA) and Institute of Electrical and Electronics Engineers (IEEE) 1594 "Firewire".

The I/O adapter(s) 516 can communicate with external I/O devices 524 which can include, for example, user interface device(s) including a display and/or a touch-screen display 540, printer, keypad, keyboard, communication logic, wired and/or wireless, storage device(s) including hard disk drives ("HDD"), solid-state drives ("SSD"), removable storage media, Digital Video Disk (DVD) drive, Compact Disk (CD) drive, Redundant Array of Independent Disks (RAID), tape drive or other storage device. The storage devices can be communicatively and/or physically coupled together through one or more buses using one or more of a variety of protocols including, but not limited to, SAS (Serial Attached SCSI (Small Computer System Interface)), PCIe (Peripheral Component Interconnect Express), NVMe (NVM Express) over PCIe (Peripheral Component Interconnect Express), and SATA (Serial ATA (Advanced Technology Attachment)). The display and/or a touch-screen display 540 can be communicatively coupled to the processor in the SoC 504 to display data stored in the DRAM devices in the memory module 100.

Additionally, there can be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols.

The memory controller 514 can also be coupled to non-volatile memory. A non-volatile memory device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also include a byte-addressable write-in-place three dimensional crosspoint memory device, or other byte addressable write-in-place NVM devices (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

The I/O adapters 516 can include a Peripheral Component Interconnect Express (PCIe) adapter that is communicatively coupled using the NVMe (NVM Express) over PCIe (Peripheral Component Interconnect Express) protocol over bus 544 to a host interface 528 in the SSD 518. Non-Volatile Memory Express (NVMe) standards define a register level interface for host software to communicate with a non-volatile memory subsystem (for example, a Solid-state Drive (SSD)) over Peripheral Component Interconnect Express (PCIe), a high-speed serial computer expansion bus). The NVM Express standards are available at www.nvmexpress.org. The PCIe standards are available at www.pcisig.com.

An operating system 542 is software that manages computer hardware and software including memory allocation and access to I/O devices. Examples of operating systems include Microsoft® Windows®, Linux®, iOS® and Android®.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory controller, comprising:
    a Dynamic Random Access Memory (DRAM) interface to transfer data over a bus to a memory module, the memory module comprising at least two sub channels, each sub channel comprising a plurality of DRAM devices;
    a first refresh mode register to store a first refresh rate for a first sub channel of the memory module;
    a second refresh mode register to store a second refresh rate for a second sub channel of the memory module; and
    a memory module refresh mode controller to modify the first refresh rate based a first temperature read from a first thermal sensor in the first sub channel of the memory module and to modify the second refresh rate based on a second temperature read from a second thermal sensor in the second sub channel of the memory module to refresh the plurality of DRAM devices in the first sub channel at the first refresh rate and to refresh the plurality of DRAM devices in the second sub channel at the second refresh rate, a difference between the first temperature and the second temperature is greater than 13° C.

2. The memory controller of claim 1, wherein the first refresh rate is 1× refresh rate or 2× refresh rate.

3. The memory controller of claim 1, wherein the first thermal sensor to couple to the memory controller via one of a standard I3C serial bus or System Management Bus (SMBus).

4. The memory controller of claim 1, wherein the memory module refresh mode controller to periodically read a register in the first thermal sensor to determine if the first temperature is above a high temperature or below a low temperature, the first refresh rate is 2× refresh rate while the first temperature is above the high temperature.

5. The memory controller of claim 4, wherein the low temperature is 85° C. or less and the high temperature is greater than 85° C.

6. The memory controller of claim 1, wherein the DRAM interface is a double data rate (DDR) high-speed DRAM interface.

7. A method comprising:
transferring, by a Dynamic Random Access Memory (DRAM) interface, data over a bus to a memory module, the memory module comprising at least two sub channels, each sub channel comprising a plurality of DRAM devices;
storing, in a first refresh mode register, a first refresh rate for a first sub channel of the memory module;
storing in a second refresh mode register, a second refresh rate for a second sub channel of the memory module; and
modifying, by a memory module refresh mode controller, the first refresh rate based a first temperature read from a first thermal sensor in the first sub channel;
modifying, by the memory module refresh mode controller, the second refresh rate based on a second temperature read from a second thermal sensor in the second sub channel of the memory module; and
refreshing the plurality of DRAM devices in the first sub channel at the first refresh rate and the plurality of DRAM devices in the second sub channel at the second refresh rate, a difference between the first temperature and the second temperature is greater than 13° C.

8. The method of claim 7, wherein the first refresh rate is 1× refresh rate or 2× refresh rate.

9. The method of claim 7, further comprising:
accessing the first thermal sensor and the second thermal sensor via one of a standard I3C serial bus or System Management Bus (SMBus).

10. The method of claim 7, further comprising:
periodically reading, by the memory module refresh mode controller, a register in the first thermal sensor to determine if the first temperature is above a high temperature or below a low temperature the first refresh rate is 2× refresh rate while the first temperature is above the high temperature.

11. The method of claim 10, wherein the low temperature is 85° C. or less and the high temperature is greater than 85° C.

12. The method of claim 7, wherein the DRAM interface is a double data rate (DDR) high-speed DRAM interface.

13. A system comprising:
a memory module comprising at least two sub channels, each sub channel comprising a plurality of Dynamic Random Access Memory (DRAM) devices;
a memory controller comprising:
a DRAM interface to transfer data over a bus to the memory module;
a first refresh mode register to store a first refresh rate for a first sub channel of the memory module;
a second refresh mode register to store a second refresh rate for a second sub channel of the memory module; and
a memory module refresh mode controller to modify the first refresh rate based a first temperature read from a first thermal sensor in the first sub channel of the memory module and to modify the second refresh rate based on a second temperature read from a second thermal sensor in the second sub channel of the memory module to refresh the plurality of DRAM devices in the first sub channel at the first refresh rate and to refresh the plurality of DRAM devices in the second sub channel at the second refresh rate, a difference between the first temperature and the second temperature is greater than 13° C.; and
a display communicatively coupled to a processor to display data stored in the DRAM devices.

14. The system of claim 13, wherein the first refresh rate is 1× refresh rate or 2× refresh rate.

15. The system of claim 13, wherein the first thermal sensor to couple to the memory controller via one of a standard I3C serial bus or System Management Bus (SMBus).

16. The system of claim 13, wherein the memory module refresh mode controller to periodically read a register in the first thermal sensor to determine if the first temperature is above a high temperature or below a low temperature the first refresh rate is 2× refresh rate while the first temperature is above the high temperature.

17. The system of claim 16, wherein the low temperature is 85° C. or less and the high temperature is greater than 85° C.

* * * * *